(12) United States Patent
Yun et al.

(10) Patent No.: US 6,933,163 B2
(45) Date of Patent: Aug. 23, 2005

(54) FABRICATING INTEGRATED MICRO-ELECTROMECHANICAL SYSTEMS USING AN INTERMEDIATE ELECTRODE LAYER

(75) Inventors: Chang-Han Yun, Boston, MA (US);
Lawrence E. Felton, Hopkinton, MA (US); Maurice S. Karpman, Brookline, MA (US); John A. Yasaitis, Lexington, MA (US); Michael W. Judy, Wakefield, MA (US); Colin Gormley, Belfast (GB)

(73) Assignee: Analog Devices, Inc., Norwood, MA (US)

( * ) Notice: Subject to any disclaimer, the term of this patent is extended or adjusted under 35 U.S.C. 154(b) by 46 days.

(21) Appl. No.: 10/259,173

(22) Filed: Sep. 27, 2002

(65) Prior Publication Data

US 2004/0063239 A1 Apr. 1, 2004

(51) Int. Cl.[7] .............................................. H01L 21/00
(52) U.S. Cl. ...................................................... 438/48
(58) Field of Search .............................. 438/48, 52, 31

(56) References Cited

U.S. PATENT DOCUMENTS

| | | | | |
|---|---|---|---|---|
| 4,786,357 A | | 11/1988 | Campanelli et al. | ........ 156/633 |
| 5,173,392 A | * | 12/1992 | Miersch et al. | ........ 430/311 |
| 5,323,051 A | | 6/1994 | Adams et al. | .............. 257/417 |
| 5,535,526 A | | 7/1996 | White | ........................ 34/78 |
| 5,594,979 A | | 1/1997 | Borchelt et al. | ........... 29/25.35 |
| 5,604,160 A | | 2/1997 | Warfield | .................... 437/209 |
| 5,668,033 A | | 9/1997 | Ohara et al. | ................. 438/113 |
| 5,761,350 A | * | 6/1998 | Koh | ............................. 385/14 |
| 5,798,557 A | | 8/1998 | Salatino et al. | ............. 257/416 |
| 5,824,177 A | | 10/1998 | Yoshihara et al. | .......... 156/250 |
| 5,915,168 A | | 6/1999 | Salatino et al. | ............. 438/110 |
| 6,297,072 B1 | * | 10/2001 | Tilmans et al. | ............. 438/106 |

(Continued)

FOREIGN PATENT DOCUMENTS

| | | | |
|---|---|---|---|
| EP | 1 096 564 A1 | 5/2001 | .......... H01L/23/04 |
| JP | 2001144117 A | 5/2001 | .......... H01L/21/56 |
| JP | 2001269900 A | 10/2001 | ............. B81C/1/00 |

OTHER PUBLICATIONS

Lee et al., "Fabrication of Silcion Optical Scanner for Laser Display" 2000 IEEE Conference on LEOS, Aug. 21–24, 2000, pp 13–14.*

Smith et al., Micromachined Packaging for Chemical Microsensors, IEEE Trans, Electron Devices, Jun. 1988, vol. 35, No. 6, pp. 192–197.

Petersen et al., Silicon Fusion Bonding for Pressure Sensors, Rec. of the IEEE Solid–State Sensor and Actuator Workshop, 1988, pp. 209–212.

Rudolf et al., Silicon Microaccelerometer, Transducers' 87, Rec. of the 4th Int. Conf. on Solid–State Sensors and Actuators, 1987, pp. 376–379.

Ko et al., Bonding Techniques for Microsensors, Micromachining and Micropackaging of Tansducers, 1985, pp. 198–208.

Roylance et al., A Batch–Fabricated Silicon Accelerometer, IEEE Trans. Electron Devices, Dec. 1979, vol. ED–26, No. 12, pp. 352–358.

Yoshio Awatani et al., Damage Free Dicing Method for MEMS Devices, International Conference on Opical MEMs Conference Digest, pp. 137–138, Aug. 20–23, 2002.

*Primary Examiner*—W. David Coleman
(74) *Attorney, Agent, or Firm*—Bromberg & Sunstein LLP

(57) ABSTRACT

An intermediate electrode layer is used to fabricate an integrated micro-electromechanical system. An intermediate electrode layer is formed on an integrated circuit wafer. The intermediate electrode layer places drive electrodes a predetermined height above the surface of the integrated circuit wafer. A micro-electromechanical system wafer having micromachined optical mirrors is bonded to the integrated circuit wafer such that the drive electrodes are positioned a predetermined distance from the optical mirrors.

7 Claims, 11 Drawing Sheets

U.S. PATENT DOCUMENTS

| | | | |
|---|---|---|---|
| 6,303,986 B1 | 10/2001 | Shook | 257/680 |
| 6,327,407 B1 | 12/2001 | Mitsuda et al. | 385/49 |
| 6,373,620 B1 | 4/2002 | Wang | 359/315 |
| 6,516,671 B2 * | 2/2003 | Romo et al. | 73/718 |
| 6,543,286 B2 | 4/2003 | Garverick et al. | 73/514.18 |
| 6,555,417 B2 | 4/2003 | Spooner et al. | 438/113 |
| 6,587,626 B2 * | 7/2003 | Beguin et al. | 385/125 |
| 6,620,642 B2 | 9/2003 | Dudoff et al. | 438/26 |
| 6,621,137 B1 * | 9/2003 | Ma et al. | 257/528 |
| 6,706,546 B2 * | 3/2004 | Yoshimura et al. | 438/31 |
| 2002/0021055 A1 * | 2/2002 | Lee et al. | 310/309 |
| 2002/0027294 A1 | 3/2002 | Neuhaus et al. | 257/778 |
| 2002/0045030 A1 * | 4/2002 | Ozin et al. | 428/173 |
| 2002/0054422 A1 | 5/2002 | Carr et al. | 359/291 |
| 2002/0074637 A1 | 6/2002 | McFarland | 257/686 |
| 2002/0088988 A1 | 7/2002 | Silverbrook | 257/99 |
| 2002/0090180 A1 | 7/2002 | Silverbrook | 385/92 |
| 2002/0109894 A1 * | 8/2002 | Clark et al. | 359/224 |
| 2002/0115263 A1 | 8/2002 | Worth et al. | 438/455 |
| 2002/0197761 A1 | 12/2002 | Patel et al. | 438/52 |
| 2003/0053233 A1 * | 3/2003 | Felton | 359/883 |
| 2003/0077881 A1 | 4/2003 | Gelmi et al. | 438/464 |
| 2003/0092229 A1 | 5/2003 | Silverbrook | 438/200 |
| 2003/0113067 A1 * | 6/2003 | Koh et al. | 385/48 |
| 2003/0119278 A1 * | 6/2003 | McKinnell | 438/455 |

\* cited by examiner 100
300

900

US 6,933,163 B2

FABRICATING INTEGRATED MICRO-ELECTROMECHANICAL SYSTEMS USING AN INTERMEDIATE ELECTRODE LAYER

CROSS-REFERENCE TO RELATED APPLICATIONS

The following commonly-owned U.S. Patent Applications may be pertinent to the subject matter described herein, and are hereby incorporated herein by reference in their entireties: U.S. patent application Ser. No. 10/259,174 entitled FABRICATING COMPLEX MICRO-ELECTROMECHANICAL SYSTEMS USING A DUMMY HANDLING SUBSTRATE, filed on even date herewith in the names of Chang-Han Yun, Lawrence E. Felton, Maurice S. Karpman, John A. Yasitis, Michael W. Judy, and Colin Gormley; and U.S. patent application Ser. No. 10/259,188 entitled FABRICATING COMPLEX MICRO-ELECTROMECHANICAL SYSTEMS USING A FLIP BONDING TECHNIQUE, filed on even date herewith in the names of Chang-Han Yun, Lawrence E. Felton, Maurice S. Karpman, John A. Yasitis, Michael W. Judy, and Colin Gormley.

FIELD OF THE INVENTION

The present invention relates generally to micro-electromechanical systems (MEMS), and more particularly to fabricating integrated micro-electromechanical systems using an intermediate electrode layer.

BACKGROUND OF THE INVENTION

A micro-electromechanical system (MEMS) is a micro-machined device that includes mechanical structures that are controlled electronically. MEMS devices can be such things as optical switching devices, accelerometers, and gyroscopes. In order to increase functionality of MEMS devices, it is desirable to integrate MEMS devices with integrated circuits (ICs) in a single chip. Such a chip is often referred to as an integrated MEMS.

Integrated MEMS devices are typically fabricated in a planar fashion on one side of a wafer substrate. Mechanical and electronic structures can be formed on the wafer in any of a variety of ways, including etching into the wafer and depositing materials onto the wafer. Because the mechanical and electronic structures are formed in a single plane with structures adjacent to one another, the integrated MEMS device can encompass a relatively large chip area. Also, because the mechanical and electronic structures are formed on a single wafer, the various processes used to form the mechanical and electronic structures must be compatible with one another (i.e., a particular process should not cause damage to structures formed by earlier processes).

Optical MEMS devices include micromachined optical mirrors that are controlled electrostatically via high-voltage MEMS drive electrodes. One issue with optical MEMS devices is the distance between high-voltage MEMS drive electrodes and the micromachined mirrors they control. This distance must be very precise. Variations in the distance between the optical mirrors and the drive electrodes can result in a variety of mirror control problems.

SUMMARY OF THE INVENTION

In accordance with one aspect of the invention, an intermediate electrode layer is used to fabricate an integrated micro-electromechanical system. An intermediate electrode layer is formed on an integrated circuit wafer. The intermediate electrode layer places drive electrodes a predetermined height above the surface of the integrated circuit wafer. A micro-electromechanical system wafer having micromachined optical mirrors is bonded to the integrated circuit wafer such that the drive electrodes are positioned a predetermined distance from the optical mirrors.

In accordance with another aspect of the invention, a method for fabricating an integrated micro-electromechanical system involves providing a first micromachined apparatus having at least one micromachined optical mirror and at least one offset structure, providing a second micromachined apparatus, forming an intermediate electrode structure having at least one electrode on the second micromachined apparatus, and bonding the first micromachined apparatus to the second micromachined apparatus such that the at least one electrode is a predetermined distance from the at least one micromachined optical mirror. Forming an intermediate electrode structure having at least one electrode on the second micromachined apparatus may involve forming the intermediate electrode structure separate from the second micromachined apparatus and then bonding the intermediate electrode structure to the second micromachined apparatus or else forming the intermediate electrode structure directly on the second micromachined apparatus. Bonding the first micromachined apparatus to the second micromachined apparatus such that the at least one electrode is a predetermined distance from the at least one micromachined optical mirror typically involves aligning the at least one electrode with the at least one micromachined optical mirror, and typically also involves bonding the at least one offset structure to the second micromachined apparatus.

In accordance with another aspect of the invention, an apparatus comprises a first micromachined wafer having at least one micromachined optical mirror and at least one offset structure, a second micromachined wafer bonded to the first micromachined wafer, and an intermediate electrode structure having at least one electrode, the intermediate electrode structure formed on the second micromachined wafer and interposed between the first micromachined wafer and the second micromachined wafer such that the at least one electrode is a predetermined distance from the at least one micromachined optical mirror.

Figure 1:
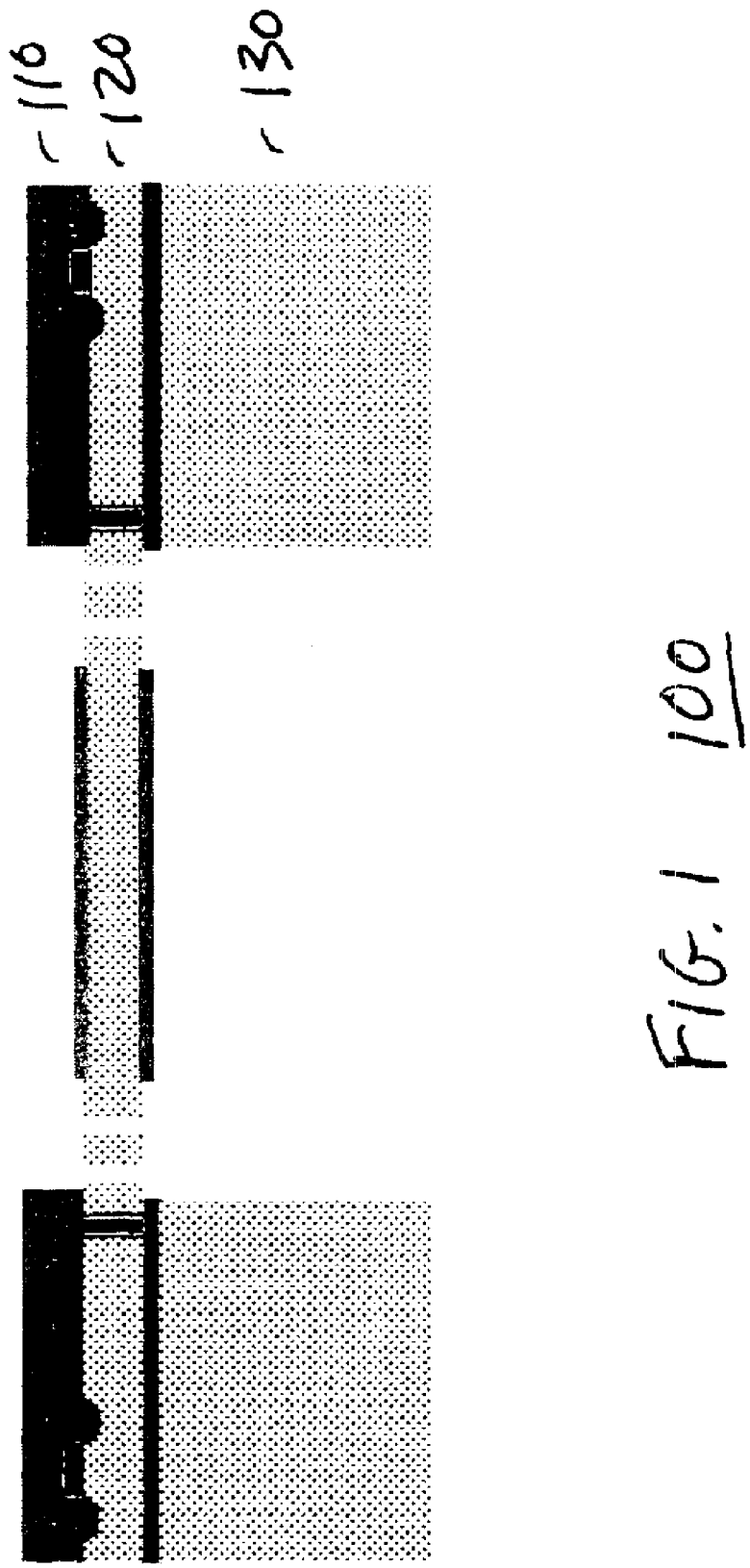
FIG. 1 shows an exemplary MEMS wafer in accordance with an embodiment of the present invention.
Figure 2:
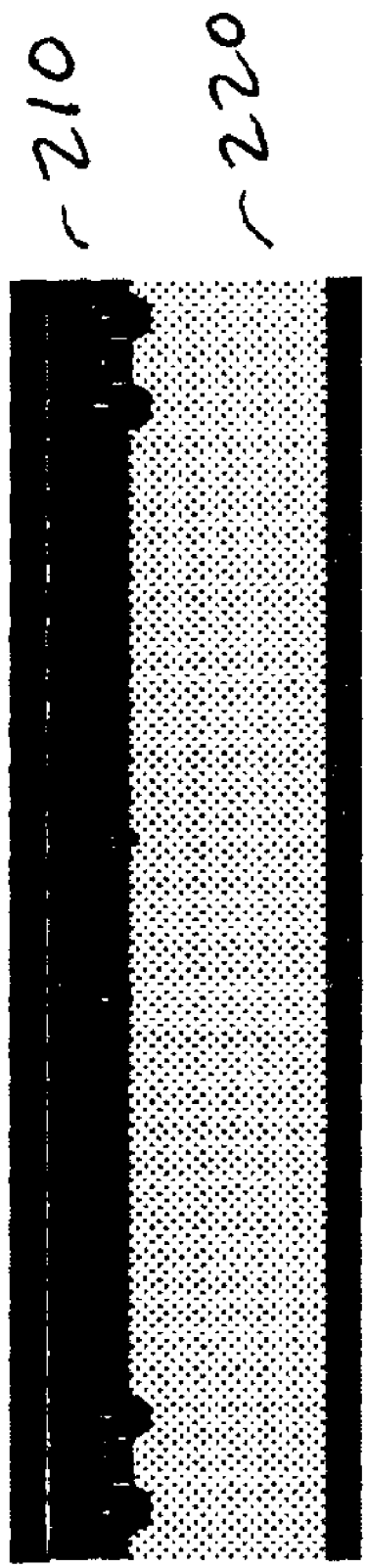
FIG. 2 shows an exemplary IC wafer in accordance with an embodiment of the present invention.
Figure 7:
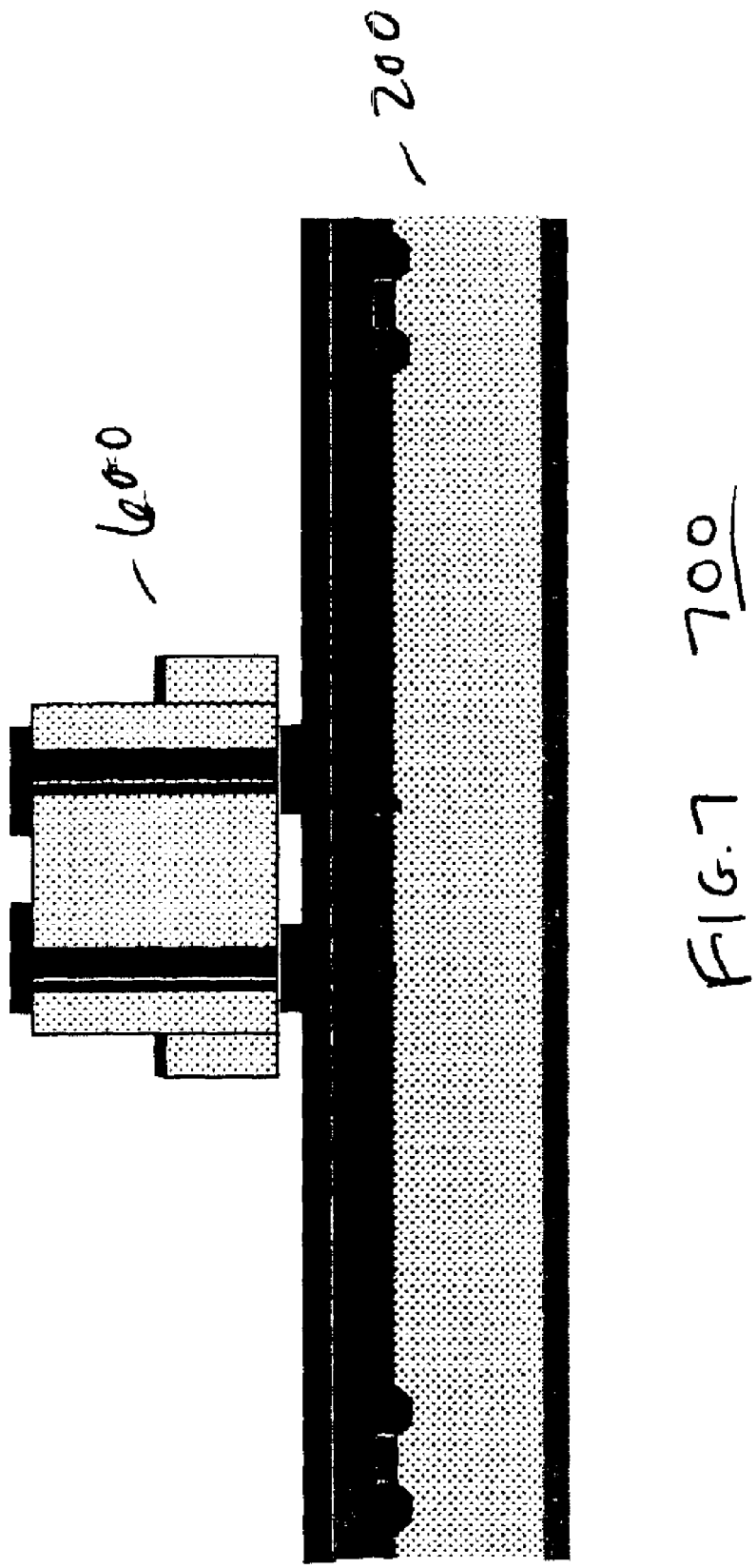
FIG. 7 shows an exemplary IC wafer formed by bonding the individual intermediate electrode layer structure of FIG.
Figure 8:
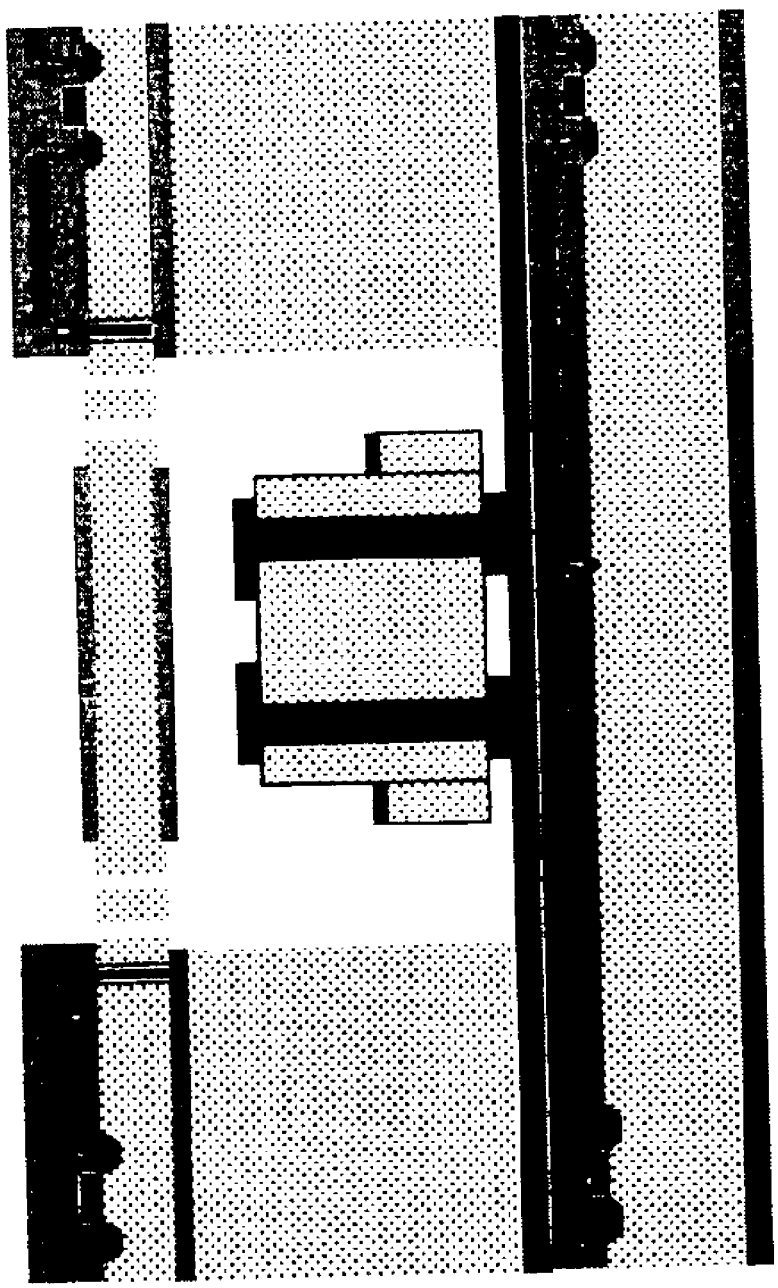
Figure 9:
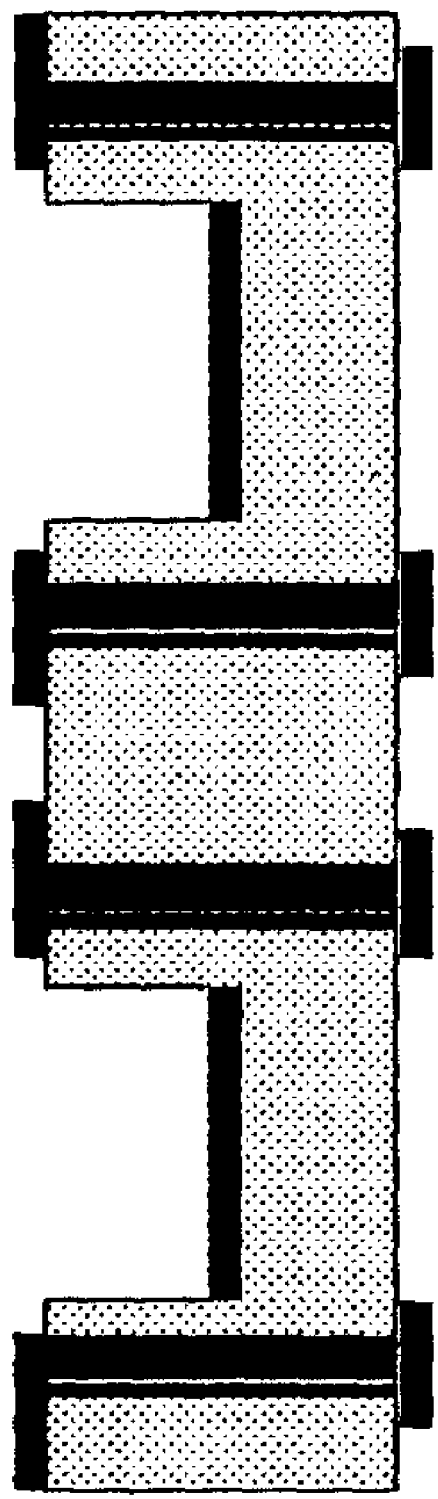
Figure 10:
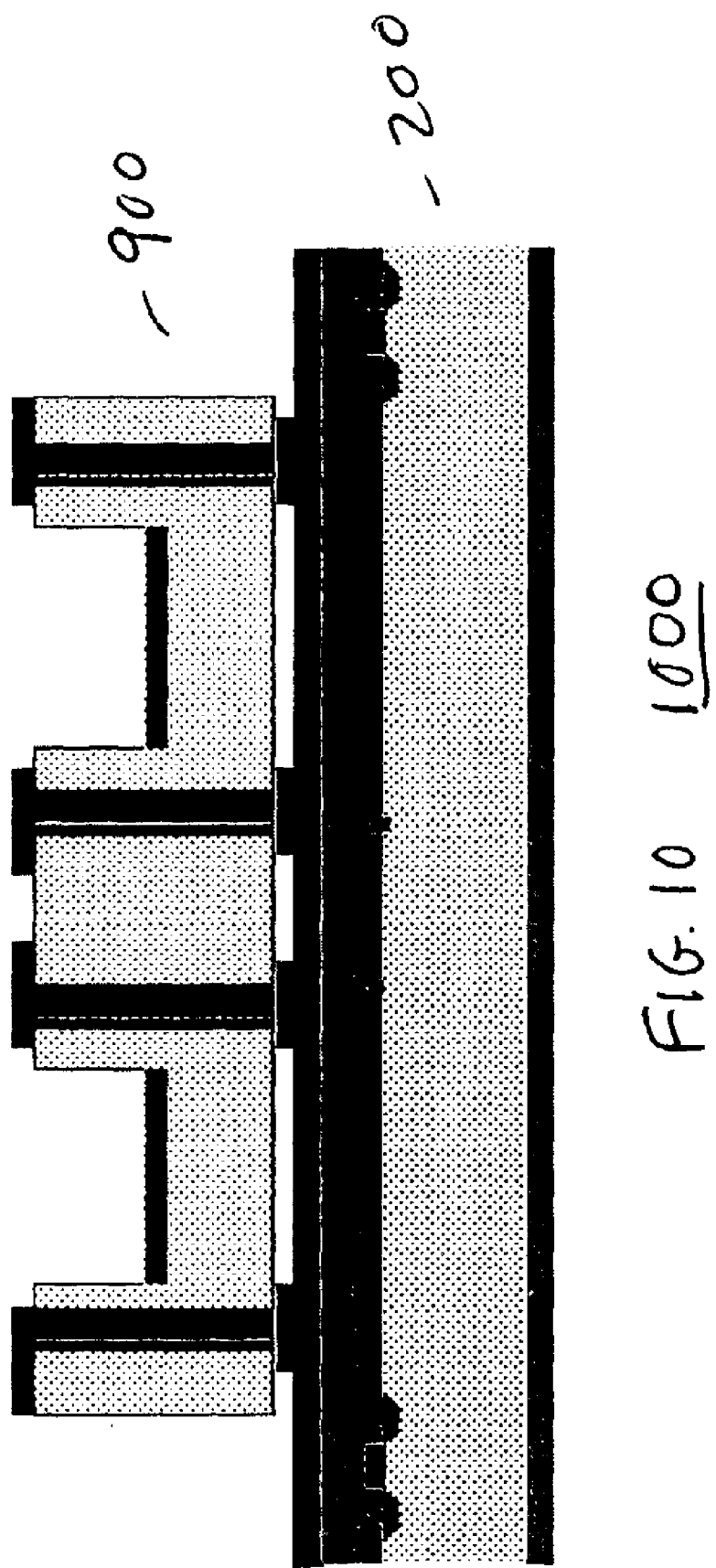
Figure 11:
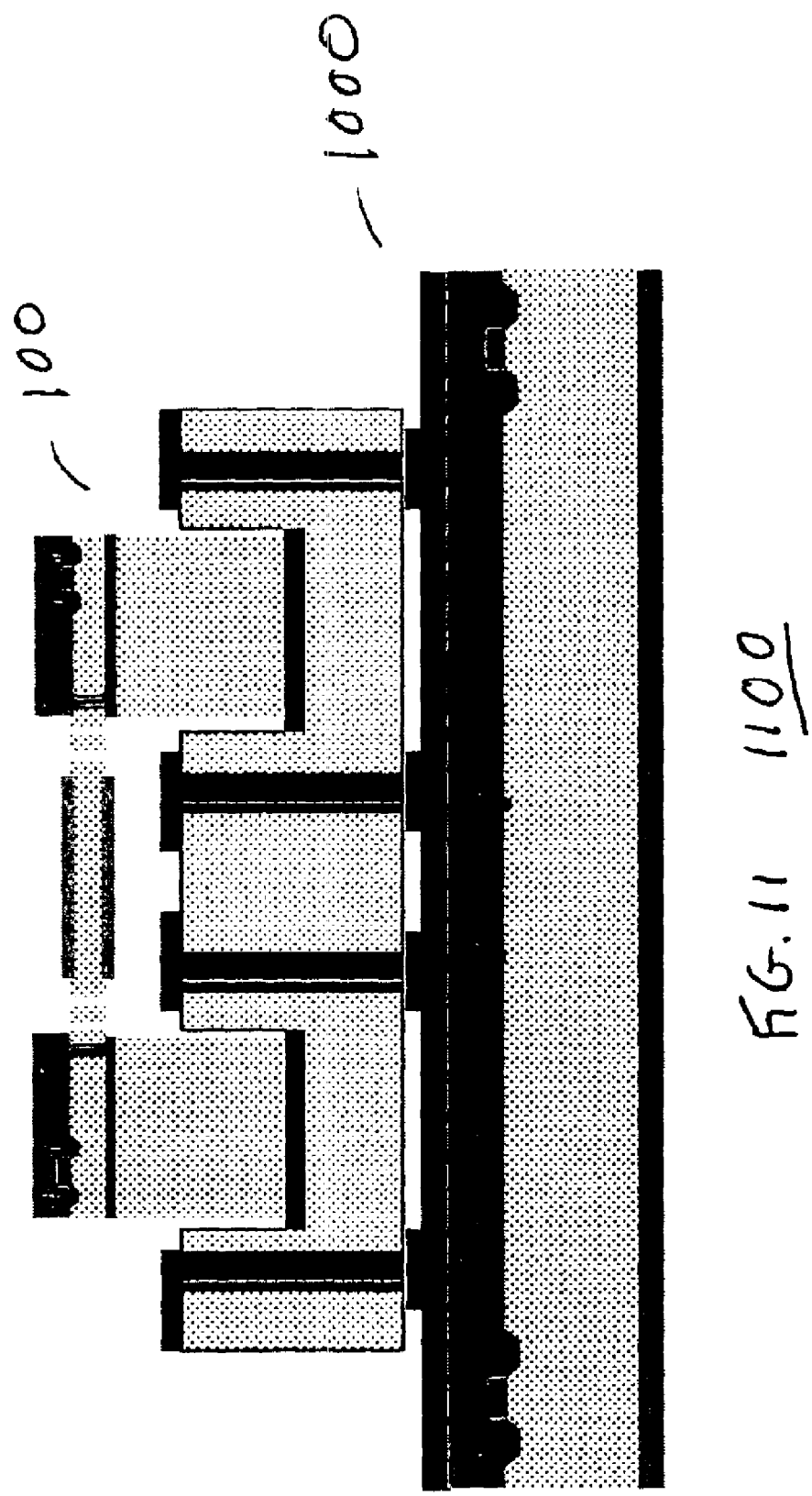

6 to the IC wafer of FIG. 2 in accordance with an embodiment of the present invention;

FIG. 8 shows an exemplary integrated MEMS device including the MEMS wafer of FIG. 1 bonded to the IC wafer of FIG. 7 in accordance with an embodiment of the present invention;

FIG. 9 shows an apparatus including multiple intermediate electrode layer structures in accordance with an embodiment of the present invention;

FIG. 10 shows an exemplary IC wafer including the apparatus of FIG. 9 bonded to the IC wafer of FIG. 2 in accordance with an embodiment of the present invention;

FIG. 11 shows an exemplary integrated MEMS device including the MEMS wafer of FIG. 1 bonded to the IC wafer of FIG. 10 in accordance with an embodiment of the present invention; and FIG. 12 is a flow chart showing an exemplary method for fabricating an integrated micro-electromechanical system in accordance with an embodiment of the present invention.

DETAILED DESCRIPTION OF A PREFERRED EMBODIMENT

In an embodiment of the present invention, an integrated MEMS device is formed using an intermediate electrode layer. Specifically, a MEMS wafer includes micromachined optical mirrors, and an integrated circuit (IC) wafer includes MEMS drive electrodes. A back side of the MEMS wafer includes offset structures that position the optical mirrors some distance from a front side of the IC wafer when the back side of the MEMS wafer is bonded to the front side of the IC wafer. In order to place the MEMS drive electrodes at a precise distance from the optical mirrors, an intermediate electrode layer is formed on the front side of the IC wafer, with the MEMS drive electrodes at the top of the intermediate electrode layer. The intermediate electrode layer is formed to the proper thickness such that, when the back side of the MEMS wafer is bonded to the front side of the IC wafer, the drive electrodes on the intermediate electrode layer are situated a predetermined distance from the optical mirrors they control. The intermediate electrode layer may be fabricated separately from the IC wafer and then bonded to the IC wafer, or else the intermediate electrode layer may be formed directly on the IC wafer. The wafers are bonded together in such a way that the intermediate electrode layer is situated within a cavity formed by the offset structures.

More specifically, the MEMS wafer typically includes various mechanical structures, low-voltage electronics, and electrical interconnects. For example, an optical MEMS wafer might include optical mirrors that are formed using an etching technique and deposited with various materials (e.g., a diffusion barrier layer, a reflective gold layer, and an anti-static material layer), as well as various electronics and electrical interconnects. These structures may be fabricated on the MEMS wafer using any of a variety of techniques, including various etching and material depositing techniques. The MEMS wafer may be any type of wafer, including a silicon, polysilicon, silicon-on-insulator (SOI), or multiple stack SOI wafer.

The IC wafer typically includes various high-voltage and other complex electronics, such as high-voltage MEMS driving electrodes, signal processors, and amplifiers. These electronics may be fabricated on the IC wafer using any of a variety of techniques, including various etching and material depositing techniques. The IC wafer may be any type of wafer, including a silicon, polysilicon, silicon-on-insulator (SOI), or multiple stack SOI wafer.

In an embodiment of the present invention, an intermediate electrode layer including MEMS drive electrodes is formed on the IC wafer. The intermediate electrode layer may be fabricated separately and then bonded to the IC wafer, or else the intermediate electrode layer may be formed directly on the IC wafer. In any case, the intermediate electrode layer is formed to an appropriate thickness such that the MEMS drive electrodes are situated a predetermined height above the plane of the IC wafer.

Once the MEMS wafer with optical mirrors and the IC wafer with intermediate electrode layer have been fabricated, the MEMS wafer is aligned with and bonded to the IC wafer. The result is a stacked structure with an intermediate electrode layer placing the MEMS drive electrodes a predetermined distance from the optical mirrors. After bonding the MEMS and IC wafers together, additional micromachining and processing may be completed on the back side of either or both of the wafers.

It should be noted that the intermediate electrode layer need not be a fixed height for all implementations, but rather the intermediate electrode layer is fabricated to an appropriate height for a given implementation in order to place the electrodes at an appropriate distance from the optical mirrors.

It should be noted that the MEMS and IC wafers may be fabricated from different types of wafers and/or different fabrication techniques for forming the various micromachined structures. This allows each wafer to be handled and processed separately using processes that are optimized for the particular wafer and types of structures to be formed on the wafer.

FIG. 1 shows an exemplary MEMS wafer 100 in accordance with an embodiment of the present invention. Among other things, the MEMS wafer 100 includes substrate 130, an optical mirror layer 120, and an electronic/interconnect layer 110. The MEMS wafer 100 may comprise a silicon, polysilicon, silicon-on-insulator (SOI), or multiple stack SOI wafer.

FIG. 2 shows an exemplary IC wafer 200 in accordance with an embodiment of the present invention. Among other things, the IC wafer 200 includes a substrate 220 and a device layer 210. The device layer 210 may include such things as integrated circuits and various for interfacing with a MEMS wafer. The IC wafer 200 may comprise a silicon, polysilicon, silicon-on-insulator (SOI), or multiple stack SOI wafer.

Figure 3:
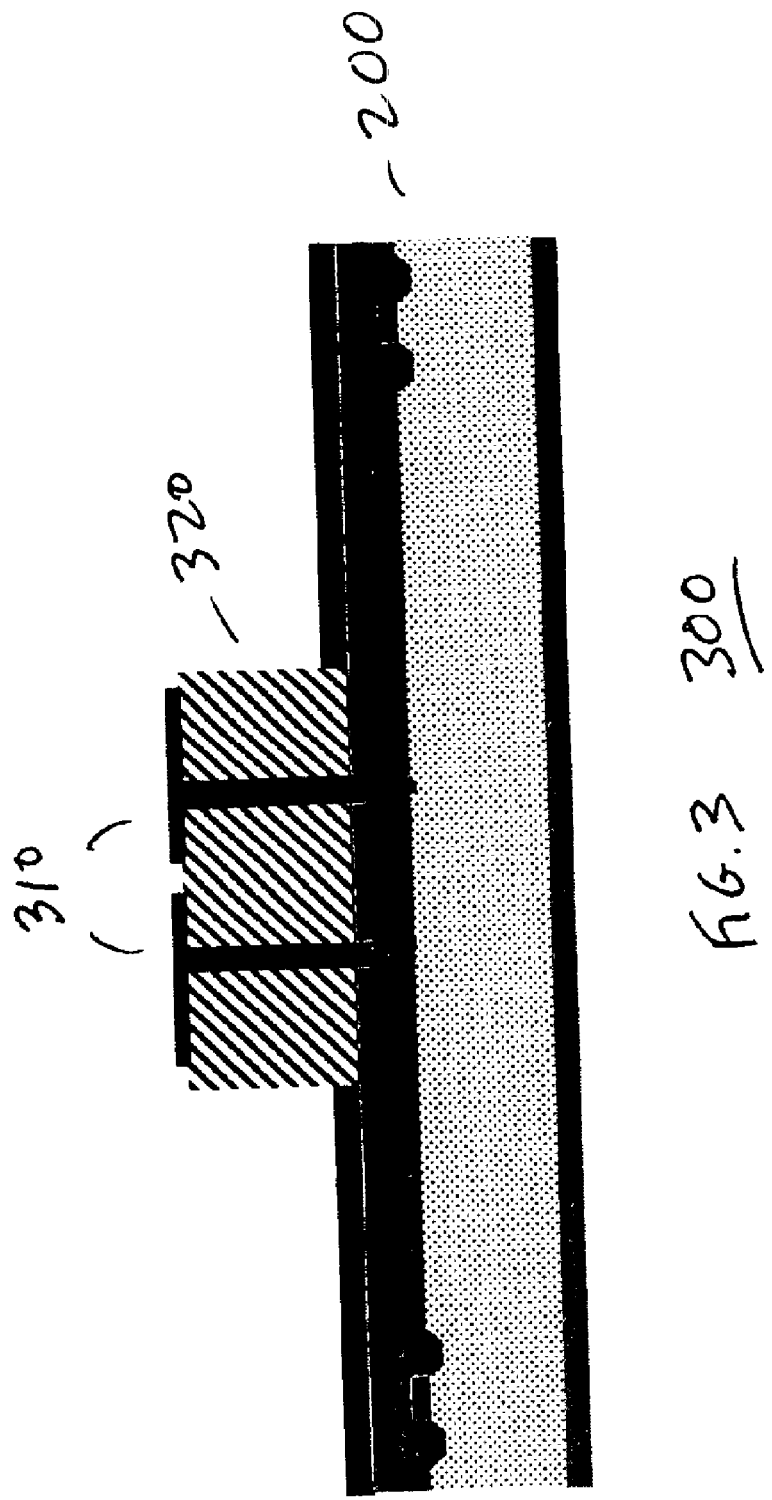
FIG. 3 shows an exemplary IC wafer with an intermediate electrode layer that is formed directly on the IC wafer in accordance with an embodiment of the present invention.

FIG. 3 shows an exemplary IC wafer 300 with an intermediate electrode layer that is formed directly on the IC wafer 200 in accordance with an embodiment of the present invention. Specifically, the intermediate electrode layer is formed by depositing a material 320 directly on the IC wafer 200, and then forming drive electrodes 310 on the material 320 and through to the IC wafer 200. The material 320 may be a polymer or a photoresist material. Exemplary materials include polymethyl methacrylate (PMMA) materials; polymethylglutarimide (PMGI) materials, which are alkaline soluble polymers derived from PMMA; and SU8 materials, which are chemically amplified, epoxy based negative resists. The electrodes 310 may be formed using any of a variety of electroplating or deposition techniques.

Figure 4:
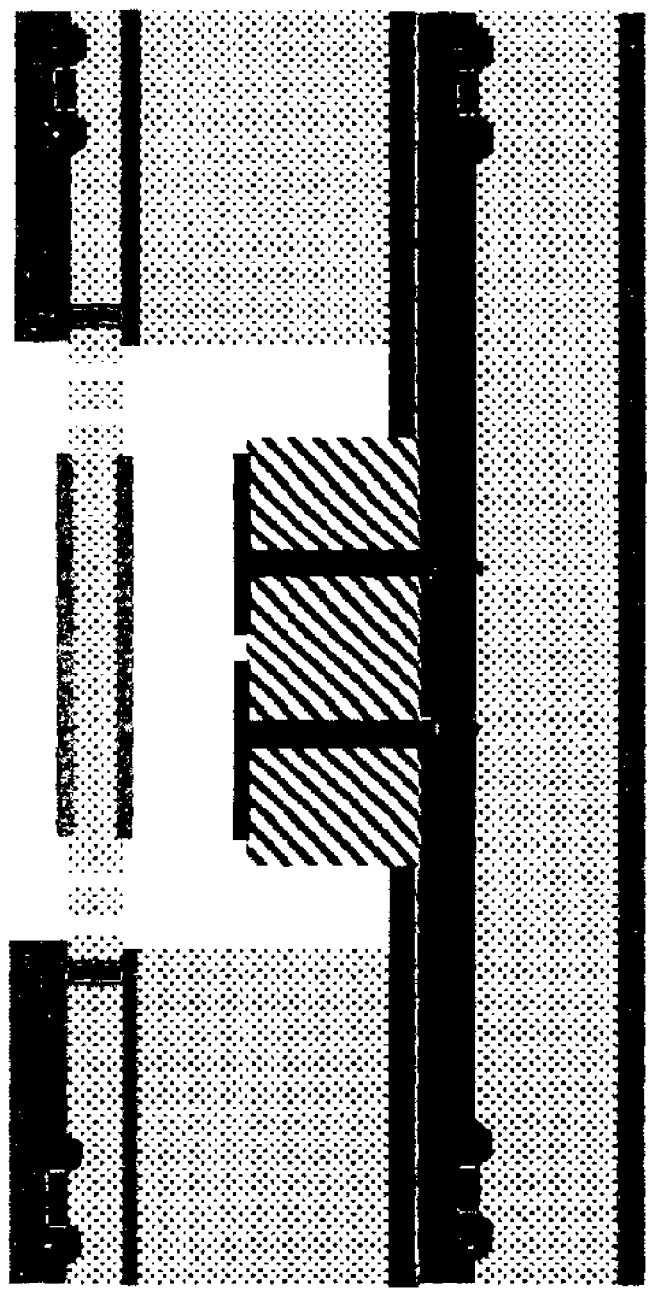
FIG. 4 shows an exemplary integrated MEMS device including the MEMS wafer of FIG. 1 bonded to the IC wafer of FIG. 3 in accordance with an embodiment of the present invention.

FIG. 4 shows an exemplary integrated MEMS device 400 having an intermediate electrode layer in accordance with an embodiment of the present invention. Specifically, the integrated MEMS device 400 includes the MEMS wafer 100 bonded to the IC wafer 300. In this configuration, the intermediate electrode layer places the MEMS drive electrodes 310 a predetermined distance from the optical mirror layer 120.

Figure 5:
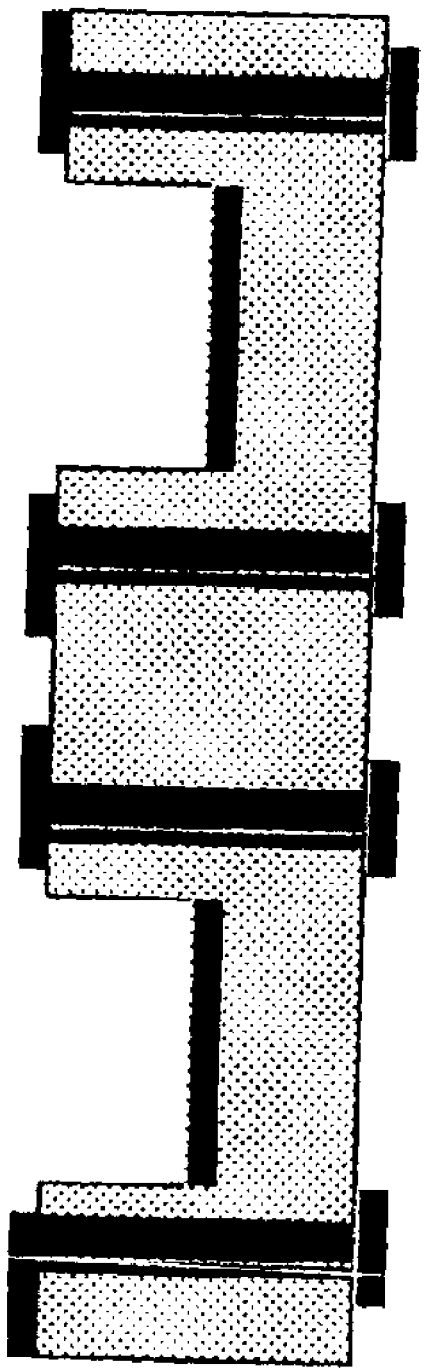
FIG. 5 shows an apparatus including multiple intermediate electrode layer structures in accordance with an embodiment of the present invention.

FIG. 5 shows an apparatus 500 including multiple intermediate electrode layer structures in accordance with an embodiment of the present invention. The apparatus 500 is formed separately from the IC wafer 200.

Figure 6:
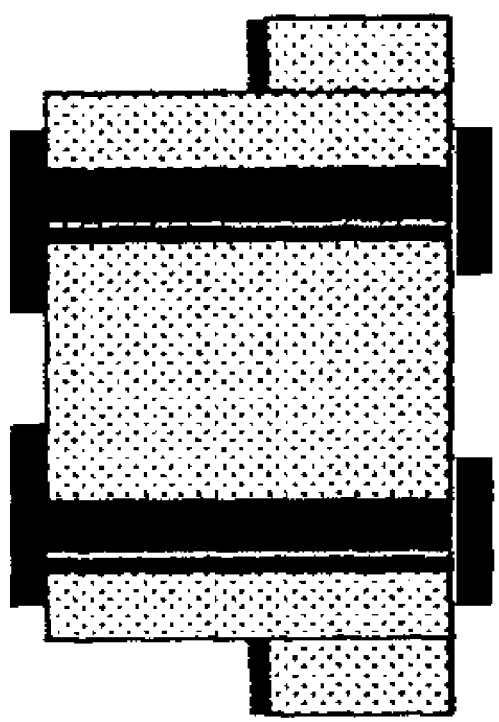
FIG. 6 shows an individual intermediate electrode layer structure formed from the apparatus shown in FIG. 5 in accordance with an embodiment of the present invention.

FIG. 6 shows an individual intermediate electrode layer structure 600 formed from the apparatus 500 in accordance with an embodiment of the present invention.

FIG. 7 shows an exemplary IC wafer 700 formed by bonding the individual intermediate electrode layer structure 600 to the IC wafer 200 in accordance with an embodiment of the present invention.

FIG. 8 shows an exemplary integrated MEMS device 800 including the MEMS wafer 100 bonded to the IC wafer 700 in accordance with an embodiment of the present invention.

FIG. 9 shows an apparatus 900 including multiple intermediate electrode layer structures in accordance with an embodiment of the present invention. The apparatus 900 is formed separately from the IC wafer 200.

FIG. 10 shows an exemplary IC wafer 1000 including the apparatus 900 bonded to the IC wafer 200 in accordance with an embodiment of the present invention.

FIG. 11 shows an exemplary integrated MEMS device 100 including the MEMS wafer 100 bonded to the IC wafer 1000, and specifically to the apparatus 900, in accordance with an embodiment of the present invention.

With regards to FIGS. 10 and 11, it should be noted that the MEMS wafer 100 can be bonded to the apparatus 900 before or after the apparatus 900 is bonded to the IC wafer 200.

Thus, the present invention may be embodied as a method for fabricating an integrated micro-electromechanical system. With reference to FIG. 12, the method involves providing a first micromachined apparatus having at least one micromachined optical mirror (block 1202), providing a second micromachined apparatus (block 1204), providing an intermediate electrode structure having at least one electrode (block 1206), bonding the intermediate electrode structure to the second micromachined apparatus (block 1208), optionally aligning the at least one electrode with the at least one micromachined optical mirror (block 1210), and bonding the first micromachined apparatus to one of the intermediate electrode structure and the second micromachined apparatus such that the at least one electrode is a predetermined distance from the at least one micromachined optical mirror (block 1212). The first micromachined apparatus may include offset structures, in which case the offset structures may be bonded to the intermediate electrode structure or the second micromachined apparatus.

The following commonly-owned U.S. Patent Applications may be pertinent to the subject matter described herein, and are hereby incorporated herein by reference in their entireties:

U.S. patent application Ser. No. 10/259,174 entitled FABRICATING COMPLEX MICRO-ELECTROMECHANICAL SYSTEMS USING A DUMMY HANDLING SUBSTRATE, filed on even date herewith in the names of Chang-Han Yun, Lawrence E. Felton, Maurice S. Karpman, John A. Yasaitis, Michael W. Judy, and Colin Gormley; and U.S. patent application Ser. No. 10/259,188 entitled FABRICATING COMPLEX MICRO-ELECTROMECHANICAL SYSTEMS USING A FLIP BONDING TECHNIQUE, filed on even date herewith in the names of Chang-Han Yun, Lawrence E. Felton, Maurice S. Karpman, John A. Yasaitis, Michael W. Judy, and Colin Gormley.

The present invention may be embodied in other specific forms without departing from the true scope of the invention. The described embodiments are to be considered in all respects only as illustrative and not restrictive.

What is claimed is:

1. A method for fabricating an integrated micro-electromechanical system, the method comprising:

providing a first micromachined apparatus having at least one micromachined optical mirror;

providing a second micromachined apparatus;

providing an intermediate electrode structure having at least one electrode, the intermediate electrode structure comprising one of a polymer material and a photoresist material;

bonding the intermediate electrode structure to the second micromachined apparatus; and bonding the first micromachined apparatus to one of the intermediate electrode structure and the second micromachined apparatus such that the at least one electrode is a predetermined distance from the at least one micromachined optical mirror.

2. The method of claim 1, wherein bonding the first micromachined apparatus to one of the intermediate electrode structure and the second micromachined apparatus such that the at least one electrode is a predetermined distance from the at least one micromachined optical mirror comprises:

aligning the at least one electrode with the at least one micromachined optical mirror.

3. The method of claim 1, wherein the first micromachined apparatus includes at least one offset structure, and wherein bonding the first micromachined apparatus to one of the intermediate electrode structure and the second micromachined apparatus such that th at least one electrode is a predetermined distance from the at least one micromachined optical mirror comprises:

bonding the at least one offset structure to one of the intermediate electrode structure and the second micromachined apparatus.

4. The method of claim 1, wherein the polymer material comprises one of:

a polymethyl methacrylate (PMMA) material; and a polymethylglutarimide (PMGI) material.

5. The method of claim 1, wherein the photoresist material comprises an SU8 material.

6. The method of claim 1, wherein the second micromachined apparatus comprises circuitry for controlling the at least one micromachined optical mirror.

7. The method of claim 6, wherein the at last one electrode comprises a drive electrode for electrostatically controlling the at least one micromachined optical mirror in response to said circuitry.

* * * * *

UNITED STATES PATENT AND TRADEMARK OFFICE
CERTIFICATE OF CORRECTION

PATENT NO. : 6,933,163 B2
DATED : August 23, 2005
INVENTOR(S) : Chang-Han Yun et al.

It is certified that error appears in the above-identified patent and that said Letters Patent is hereby corrected as shown below:

Column 6,
Line 42, replace "such that th at least one electrode" with -- such that the at least one electrode --.

Signed and Sealed this

Twenty-fourth Day of January, 2006

JON W. DUDAS
*Director of the United States Patent and Trademark Office*